(12) United States Patent
Narita

(10) Patent No.: US 7,373,126 B2
(45) Date of Patent: May 13, 2008

(54) RECEIVING APPARATUS

(75) Inventor: Masahiro Narita, Gifu (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 0 days.

(21) Appl. No.: 10/553,732

(22) PCT Filed: Apr. 21, 2004

(86) PCT No.: PCT/JP2004/005704

§ 371 (c)(1),
(2), (4) Date: Aug. 30, 2006

(87) PCT Pub. No.: WO2004/095731

PCT Pub. Date: Nov. 4, 2004

(65) Prior Publication Data

US 2007/0004353 A1    Jan. 4, 2007

(30) Foreign Application Priority Data

Apr. 21, 2003    (JP) .............................. 2003-116101

(51) Int. Cl.
*H04B 1/06* (2006.01)
(52) U.S. Cl. .................... 455/234.1; 455/136; 455/272
(58) Field of Classification Search ............. 455/234.1, 455/234.2, 136, 245.1, 247.1, 272, 251.1, 455/232.1, 561, 562.1; 375/345
See application file for complete search history.

(56) References Cited

U.S. PATENT DOCUMENTS

| | | | | |
|---|---|---|---|---|
| 5,339,086 A | * | 8/1994 | DeLuca et al. | 342/371 |
| 5,721,757 A | * | 2/1998 | Banh et al. | 375/345 |
| 6,058,318 A | * | 5/2000 | Kobayakawa et al. | 455/562.1 |
| 6,545,487 B1 | * | 4/2003 | Ly | 324/620 |
| 6,775,336 B1 | * | 8/2004 | Takaki | 375/345 |
| 6,862,442 B2 | * | 3/2005 | Sanada et al. | 455/334 |
| 6,963,733 B2 | * | 11/2005 | Eriksson et al. | 455/132 |
| 7,058,425 B1 | * | 6/2006 | Takakusaki | 455/561 |

FOREIGN PATENT DOCUMENTS

| | | |
|---|---|---|
| EP | 1 102 418 | 5/2001 |
| EP | 1 161 002 | 12/2001 |
| EP | 1 187 354 | 3/2002 |
| JP | 3-70221 | 3/1991 |
| JP | 11-4191 | 1/1999 |
| JP | 2001-53527 | 2/2001 |
| JP | 2001-196834 | 7/2001 |
| WO | WO00/60757 | 10/2000 |

* cited by examiner

*Primary Examiner*—Quochien B. Vuong
(74) *Attorney, Agent, or Firm*—Westerman, Hattori, Daniels & Adrian, LLP.

(57) ABSTRACT

The gain control signal generating unit generates a gain control signal, using a signal yielding the greatest level among signals of the respective signal processing units. The gain standardizing unit stores, in the offset storage units, offsets corresponding to gain deviations occurring in the respective signal processing units when gains of the variable gain amplifiers are uniformly controlled using the gain control signal. The offsets are added to the gain control signal for each signal processing unit, and the variable gain amplifiers are controlled, using the respective offset-added gain control signals. Under the control of the calibration control unit, the calibration signal supply unit and offset determining unit supply a calibration signal and a gain control signal for calibration, respectively. The offset determining unit determines offsets to standardize the levels of signals of the signal processing units, and updates the offsets storage units with the determined offsets.

6 Claims, 5 Drawing Sheets

| RECEIVED SIGNAL FREQUENCY | GAIN CONTROL SIGNAL LEVEL | OFFSET |
|---|---|---|
| f1 | Lmin1, Lmax1 | x1 |
| f2 | Lmin2, Lmax2 | x2 |
|  |  |  |

RECEIVING APPARATUS

TECHNICAL FIELD

The present invention relates to a receiving apparatus, in particular to a technology for uniformly conforming gains of respective signal processing units in the receiving apparatus where each of the signal processing units processes received signals of one of a plurality of antennas.

BACKGROUND ART

Wireless communication devices that selectively communicate with a target device in a desired direction by using an adaptive array system have already been put to practical use.

The adaptive array system generally comprises: a plurality of antennas; signal processing units, each of which processes either the transmitting or received signals of one of the plurality of antennas; and a directivity processing unit to form a desired directional pattern of the entire antennas by assigning amplitude and phase differences to the transmitting and received signals of each antenna.

Each signal processing unit of the adaptive array system is operated under automatic gain control (AGC) to ensure the dynamic range of the received signals.

An example of such automatic gain control in an adaptive array system is disclosed, for instance, in Japanese Laid-Open Patent Application Publication No. H03-70221. The adaptive array system has a signal processing unit (branch) with respect to each antenna, and performs automatic gain control in a manner that signals obtained by a single, representative signal processing unit are used to uniformly exercise feedback control on gains of the respective signal processing units. According to this technique, the input signal magnitude in the adaptive array is much the same before and after automatic gain control is applied, exerting no influence on the control of the adaptive array.

However, according to the above-mentioned automatic gain control of the conventional technology, a problem remains that, even if feedback control is performed uniformly on the respective signal processing units by using the same signals obtained from one signal processing unit, the gains of the respective signal processing units are not completely standardized due to variations and time-course changes in elements making up each signal processing unit.

In particular, the adaptive array system forms a desired receiving directional pattern by assigning appropriate amplitude and phase differences to the received signals obtained from the respective received signal processing units. And the respective transmitting signal processing units form a transmitting directional pattern that is the same as the receiving directional pattern by assigning, to the transmitting signals, the same amount of amplitude and phase differences at the reception.

Consequently, there is a problem that, when gain deviations exist among the respective received signal processing units, the receiving directional pattern and the transmitting directional pattern become inconsistent if the amplitude differences of the respective received signal processing units are processed as the amplitude differences of the respective transmitting signal processing units.

DISCLOSURE OF THE INVENTION

In order to solve the above problem, the present invention aims at providing a receiving apparatus in which a plurality of signal processing units respectively have standardized gains.

The receiving apparatus of the present invention, including a plurality of antennas and a plurality of signal processing units, each of which processes a received signal of one of the plurality of antennas, comprising: a gain control signal generating unit operable to generate a gain control signal based on a signal obtained from one of the plurality of signal processing units; a plurality of variable gain units, (i) each of which is included in one of the plurality of signal processing units, and (ii) whose gains are controlled based on the gain control signal; and a gain standardizing unit operable to, when the gains are uniformly controlled based on the gain control signal, assign a gain to each of the plurality of signal processing units to offset a gain deviation occurring therein.

This receiving apparatus may further comprise a directivity processing unit operable to obtain a desired directivity by processing signals obtained from the respective plurality of signal processing units, using adaptive array technique.

This structure offsets gain deviations occurring, when the gain control signal is uniformly used, due to variations in elements making up each signal processing unit and so on. As a result, the gains of the respective signal processing units are standardized with high accuracy.

Especially when directivity is formed by processing the signals obtained from the respective signal processing units, using adaptive array technique, the gain deviations for the respective signal processing units, which exert adverse effects on the directivity formation, are offset. The accuracy of the directivity formation can therefore be enhanced.

In addition, the gain standardizing unit may comprise a plurality of gain regulators, each of which is included in one of the plurality of signal processing units and assign the gain to the one of the plurality of signal processing units to offset the gain deviation occurring therein.

According to this structure, the gain standardization can be achieved using very simple elements—such as trimmer potentiometers—inserted into the respective signal processing units.

In addition, the gain standardizing unit may prestore, for each of the plurality of signal processing units, an offset corresponding to the gain deviation. Here, the gain control signal is corrected, for each of the plurality of signal processing units, by adding the prestored offset thereto, and the gain of the plurality of variable gain units are controlled, for each of the plurality of signal processing units, based on the corrected gain control signal.

According to this structure, the gains are standardized using the variable gain units. The signal processing units of a general receiving apparatus include AGC variable gain amplifiers. Therefore, using such variable gain amplifiers also for the gain standardization of the respective processing units cuts out the need of inserting variable gain units dedicated for the gain standardization into the signal processing units. This leads to lowering the number of parts required for the respective signal processing units as well as reducing a noise increase.

The gain standardizing unit may prestore, for each of the plurality of signal processing units, a plurality of offsets corresponding to the gain deviation, in association with a plurality of different received signal frequencies and a plurality of different gain control signal levels. Here, the gain control signal is corrected, for each of the plurality of signal processing units, by adding thereto one of the prestored plurality of offsets that is in association with a frequency of the received signal being actually processed and a level of the gain control signal.

According to this structure, when the gain of each signal processing unit is not uniform over the entire frequency range of the processing target, and also when the relationship between a provided gain control signal and an obtained gain varies among the signal processing units, it is possible to effectively offset the gain deviations of the respective signal processing units arising from such variations.

In addition, the receiving apparatus may further comprise: a calibration signal supply unit operable to supply a calibration signal of the same level to the respective plurality of signal processing units; and an offset determining unit operable to determine an offset for each of the plurality of signal processing units according to the calibration signal so as to standardize levels of signals obtained from the respective plurality of signal processing units. Here, the gain standardizing unit updates, for each of the plurality of signal processing units, the prestored offset to the determined offset.

According to this structure, even if gain deviations of the respective signal processing units occur due to the time-course changes and changes in the use environment, it is possible to effectively offsets such gain deviations.

BEST MODE FOR CARRYING OUT THE INVENTION

1. First Embodiment

A receiving apparatus of the first embodiment comprises: a plurality of antennas; and signal processing units, each of which processes received signals of one of the plurality of antennas. Each signal processing unit includes a variable gain amplifier to perform automatic gain control.

The receiving apparatus generates a gain control signal, using a signal providing the greatest level from among signals obtained from the respective signal processing units. Then, an offset—corresponding to a gain deviation occurring in each signal processing unit when gains of the respective variable gain amplifiers are uniformly controlled by using the gain control signal—is added to the gain control signal with respect to each signal processing unit, and the gains of the variable gain amplifiers are controlled, for each signal processing unit, by using the offset-added gain control signals.

In addition, the receiving apparatus calibrates the offsets so that an offset of each signal processing unit accurately counterbalances the deviation of the gain.

1.1 Overall Structure

Figure 1:
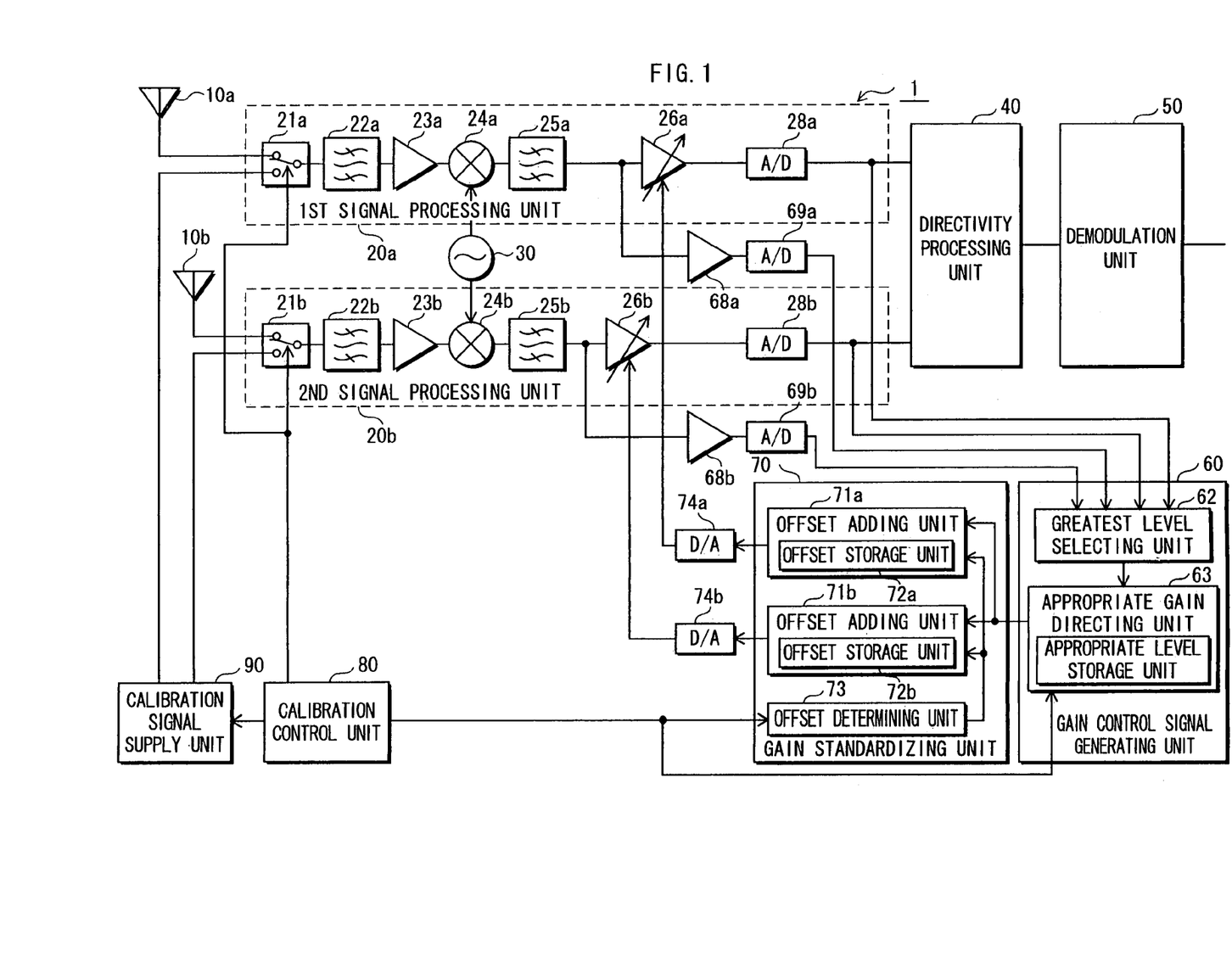
FIG. 1 is a functional block diagram showing an overall structure of a receiving apparatus 1.

FIG. 1 is a functional block diagram showing an overall structure of a receiving apparatus 1 of the first embodiment.

The receiving apparatus 1 comprises: antennas 10a and 10b; a 1st signal processing unit 20a; a 2nd signal processing unit 20b; a local oscillator 30; a directivity processing unit 40; a demodulation unit 50; a gain control signal generating unit 60; logarithmic amplifiers 68a and 68b; A/D converters 69a and 69b; a gain standardizing unit 70; D/A converters 74a and 74b; a calibration control unit 80; and a calibration signal supply unit 90.

In particular, the directivity processing unit 40, demodulation unit 50, gain control signal generating unit 60, gain standardizing unit 70, calibration control unit 80 and calibration signal supply unit 90 are structured by using a DSP (Digital Signal Processor), a CPU (Central Processing Unit), memory, and the like, and the function of each unit is achieved by the DSP or CPU executing a program stored in the memory.

The 1st signal processing unit 20a acquires a signal received by the antenna 10a via a signal selection switch 21a. The received signal is passed through a BPF 22a into a low noise amplifier 23a for amplification, and then the frequency is converted by a mixer 24a. After being passed through a BPF 25a and amplified by a variable gain amplifier 26a, the received signal is converted to a digital signal by an A/D converter 28a, and then supplied to the directivity processing unit 40 and the gain control signal generating unit 60.

The variable gain amplifier 26a is under automatic gain control based on a signal fed back via the gain control signal generating unit 60 and gain standardizing unit 70.

The logarithmic amplifier 68a converts the level of the signal input to the variable gain amplifier 26a into a logarithmic value, and then the A/D converter 69a converts the level, after the logarithmic conversion, into a digital signal, which is supplied to the gain control signal generating unit 60.

The 2nd signal processing unit 20b also has the same structure as the 1st signal processing unit 20a.

The directivity processing unit 40 applies, with respect to each signal processing unit, amplitude and phase differences to the signals supplied from the 1st and 2nd signal processing units 20a and 20b, respectively, and combines these signals to thereby selectively form a directional pattern having the gain in a desired direction, which enables to selectively derive a signal transmitted from a desired communication terminal.

The demodulation unit 50 demodulates the derived signal to thereby generate an information signal, which is then passed over to an information processing unit or information communication network (not shown in the figure above), or alternatively, is D/A converted to an audio signal, which is then sent out from a speaker (not shown in the figure).

1.2 Details of Gain Control Signal Generating Unit 60 and Gain Standardizing Unit 70

In the gain control signal generating unit 60, a greatest level selecting unit 62 informs an appropriate gain directing unit 63 of the greatest value from among logarithmically expressed level values supplied by the A/D converters 69a and 69b in a past predetermined time period.

An appropriate level storage unit 64 stores in advance an appropriate logarithmic level value that achieves the greatest possible dynamic range allowing to maintain the linearity of the signal. The appropriate gain directing unit 63 compares the stored appropriate level value against the informed, greatest logarithmic level value. When the greatest value is larger than the appropriate level value, the appropriate gain directing unit 63 sends a gain control signal directing a reduction in the gain to the gain standardizing unit 70. Otherwise, the appropriate gain directing unit 63 sends, to the gain standardizing unit 70, a gain control signal directing an increase in the gain.

Additionally, when the time fluctuation of the greatest value of the above-mentioned logarithmic level value converges within a predetermined range, the greatest level selecting unit 62 informs the appropriate gain directing unit 63 of the greatest value from among the linear level values which are level values supplied by the A/D converters 28a and 28b in a past predetermined time period.

The appropriate level storage unit 64 also stores in advance an appropriate linear level value. Then, when the greatest linear level value is informed from the greatest level selecting unit 62, the appropriate level storage unit 64 sends, to the gain standardizing unit 70, a corresponding gain control signal determined as a result of comparison of the appropriate linear level value with the informed, greatest linear level value.

When the time fluctuation of the greatest linear level value diverges outside the predetermined range, the greatest level selecting unit 62 selects a greatest logarithmic level value again.

An offset storage unit 72a stores in advance an offset for the 1st signal processing unit 20a while an offset storage unit 72b stores in advance an offset for the 2nd signal processing unit 20b. These offsets are values that, when the variable gain amplifiers 26a and 26b are individually controlled by the gain control signal to which the corresponding offset (i.e. the offset for the 1st signal processing unit 20a and the offset for the 2nd signal processing unit 20b, respectively) has been added, the 1st and 2nd signal processing units 20a and 20b exhibit the same gain.

For example, the following technique can be used to obtain such offsets. In the manufacturing process of the receiving apparatus, the offset values are changed within predetermined ranges while adjustment signals of the same level are being input to the antennas 10a and 10b, respectively. Then, the offset values of when the 1st and 2nd signal processing units 20a and 20b yield signals of the same level are stored in the offset storage units 72a and 72b.

In addition, the offset values can be calibrated in an operation phase of the receiving apparatus, as described hereinafter.

With respect to each signal processing unit, offset adding units 71a and 71b correct the gain control signal supplied from the gain control signal generating unit 60 by adding the offsets stored in the offset storage unit 72a and 72b, respectively. Then, the respective corrected gain control signals are converted by the D/A converters 74a and 74b into analog voltage signals, and the variable gain amplifiers 26a and 26b are correspondingly controlled by using the converted analog voltage signals.

1.3 Details of Offset Calibration Process

The offset calibration process is implemented by using a calibration signal and a gain control signal for calibration in an operation phase of the receiving apparatus, in order to counterbalance the gain deviations of the respective signal processing units arising from the time-course changes and changes in the use environment.

Figure 2:
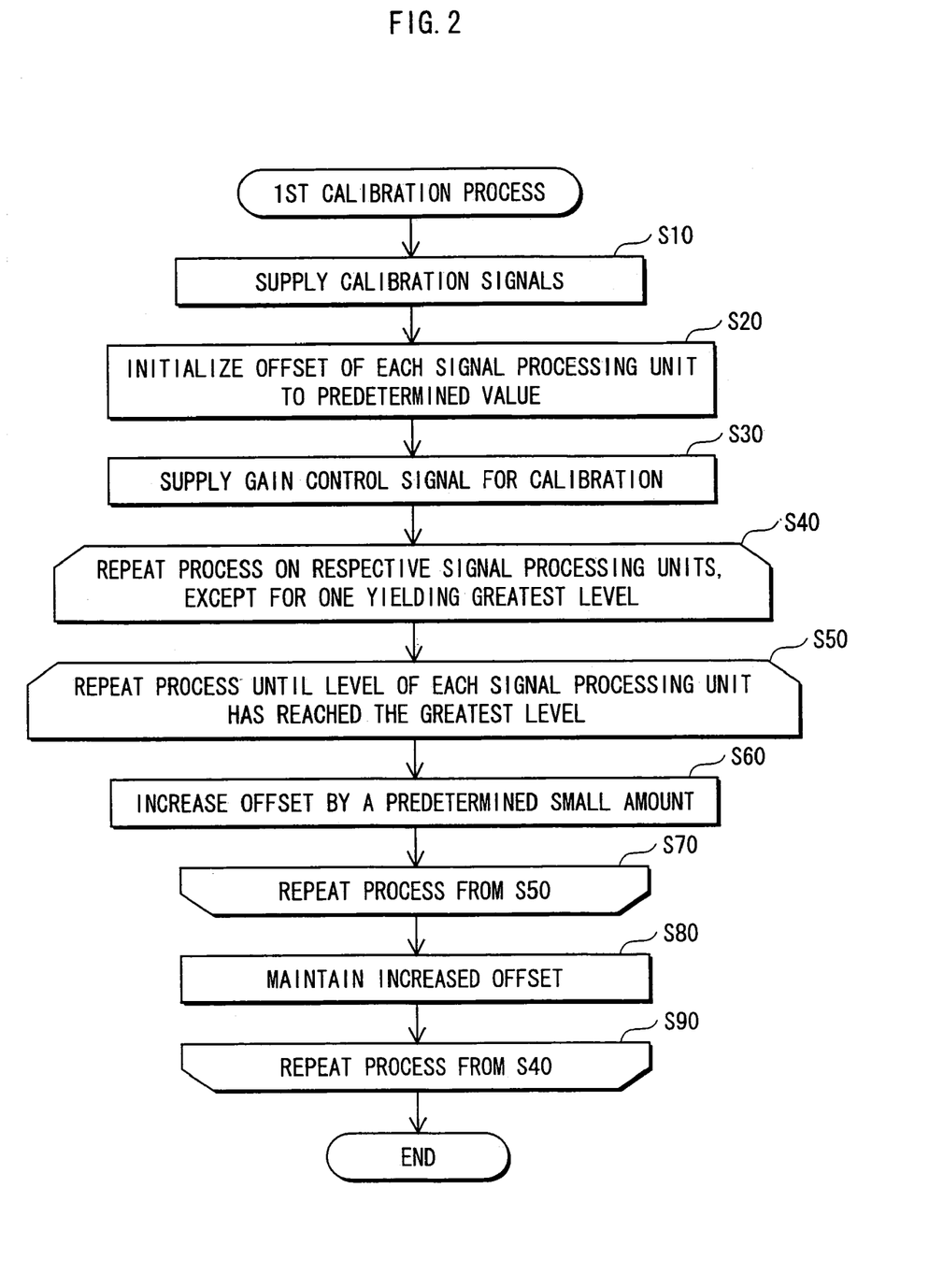
FIG. 2 is a flowchart showing a 1st offset calibration process.

FIG. 2 is a flowchart showing the offset calibration process implemented by each unit of the receiving apparatus 1 under the control of the calibration control unit 80.

The calibration signal supply unit 90 supplies calibration signals of the same level to the 1st and 2nd signal processing units 20a and 20b, and the signal selection switches 21a and 21b individually select the calibration signals according to a switching signal from the calibration control unit 80 (Step S10).

An offset determining unit 73 initializes the offset storage units 72a and 72b with the same initial value (Step S20), and supplies a gain control signal for calibration to the offset adding units 71a and 71b (Step S30). Note that, at this point, the gain control signal generating unit 60 stops the output of the gain control signal.

The greatest level selecting unit 62 compares levels of the signals supplied from the respective signal processing units, and selects the greatest value. The calibration control unit 80 repeats the following processing steps (Steps S40 to S90) with respect to each of the respective signal processing units, except for one yielding the greatest value selected by the greatest level selecting unit 62.

Until the greatest level selecting unit 62 determines that the level of a signal obtained from each signal processing unit has reached the greatest value, the offset determining unit 73 directs the variable gain amplifier of the signal processing unit to increase the gain by increasing the offset of the offset storage unit corresponding to the signal processing unit by very small amount (Steps S50 to S70).

The offset storage unit corresponding to the signal processing unit maintains the increased offset (Step S80).

According to the offset calibration process, signals of the same level are yielded from the respective signal processing units for the same calibration signal and the same gain control signal for calibration.

2. Second Embodiment

A receiving apparatus according to the second embodiment differs from the receiving apparatus of the first embodiment in using offsets that are associated with different multiple received signal frequencies as well as different multiple gain control signal levels and stored in advance with respect to each signal processing unit. The following describes mainly the difference from the receiving apparatus of the first embodiment.

Figure 3:
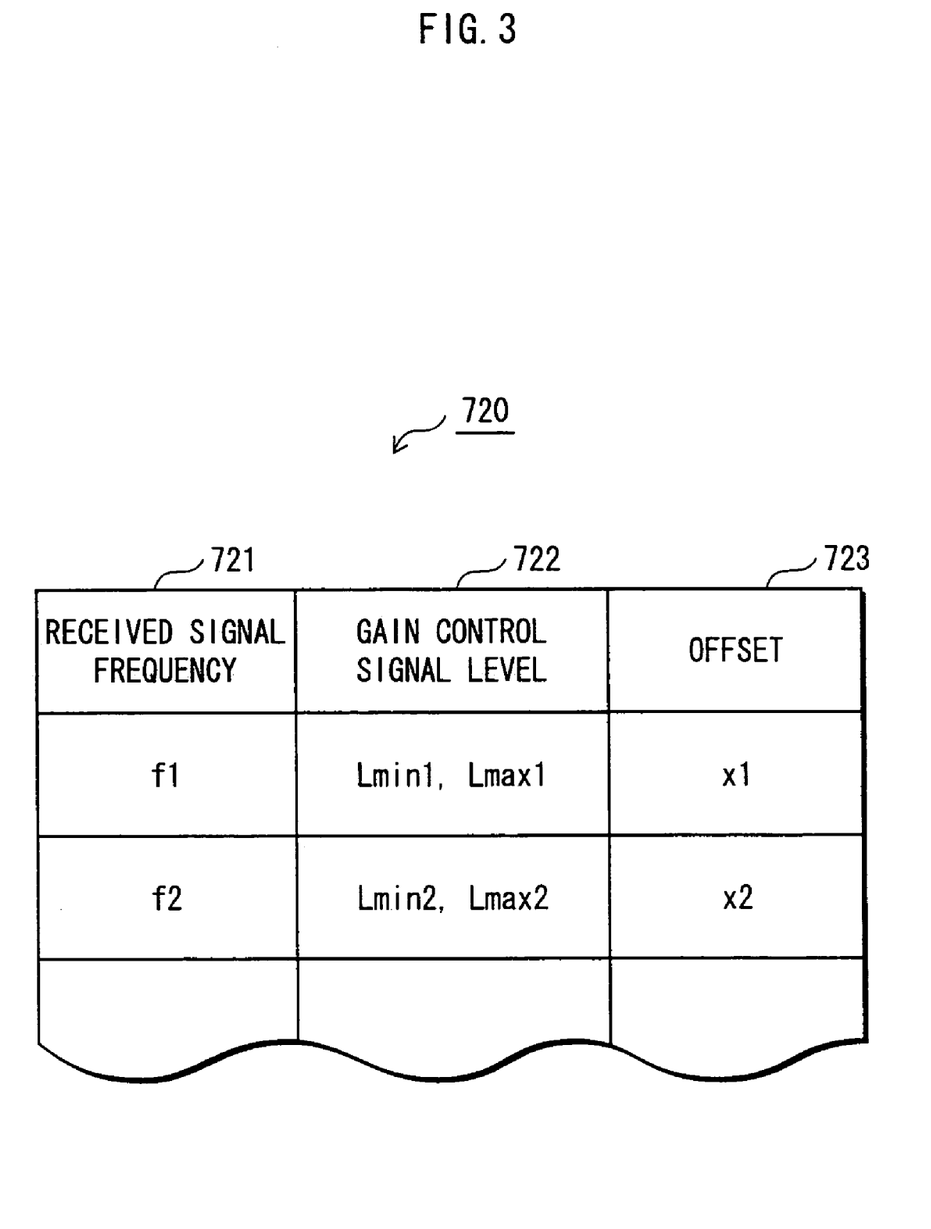
FIG. 3 is an example of an offset table.

FIG. 3 shows an offset table 720 provided in the offset storage unit of each signal processing unit in the receiving apparatus of the second embodiment. Here, offsets are stored in association with different multiple received signal frequencies and different multiple gain control signal levels.

The offset table 720, which is specifically prepared for each signal processing unit, includes with respect to each row: a received signal carrier frequency in a received signal frequency column 721; lower and upper limits showing the level range of the gain control signal in a gain control signal level column 722; and, in an offset column 723, an offset value to be added to a gain control signal having the range of level shown in the same row when a received signal having the carrier frequency shown in the same row is processed.

The gain standardizing unit of the second embodiment is informed of the received signal carrier frequency from a controller (not shown in the figure) controlling the entire receiving apparatus, and also discriminates the level range of a provided gain control signal. Then, the gain standardizing unit achieves correction of the gain control signal, with respect to each signal processing unit, by adding, to the gain control signal, an offset associated with the informed carrier frequency and the discriminated level range.

Practically speaking, the gain of each signal processing unit is not uniform over the entire frequency range of the processing target, and furthermore, the relationship between a provided gain control signal and an obtained gain varies among the signal processing units. By adopting the structure of the second embodiment, however, it is possible to effectively counterbalance the gain deviation for each signal processing unit arising from such variations.

Figure 4:
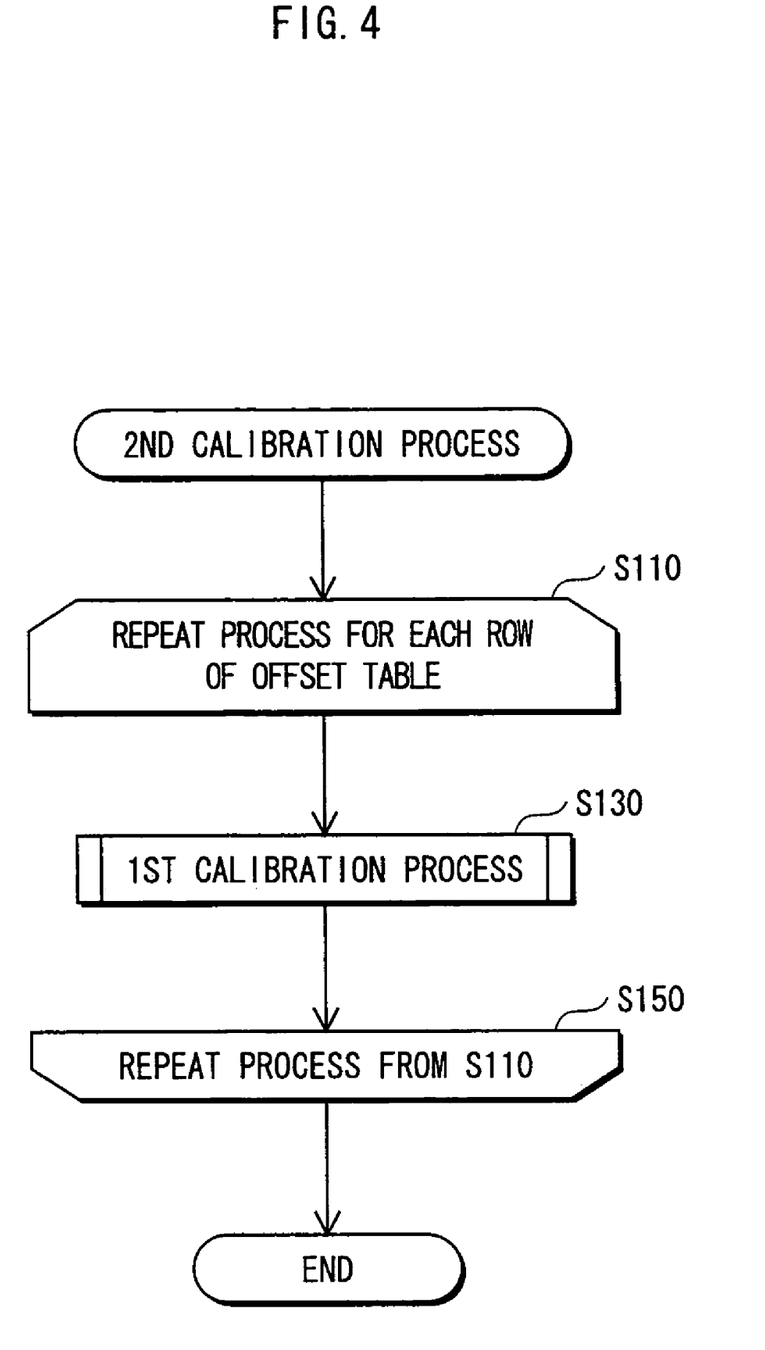
FIG. 4 is a flowchart showing a 2nd offset calibration process.

FIG. 4 is a flowchart showing an offset calibration process according to the second embodiment.

The offset calibration process of the second embodiment involves the use of a calibration signal of a received signal frequency included in each row of the offset table 720 and a gain control signal for calibration with a level corresponding to the level range of the gain control signal in the same row. The offset calibration is repeated with respect to each row (Step S110). The calibration process for each row (Step S130) is the same as the process shown in the flowchart of FIG. 2.

3. Third Embodiment

A receiving apparatus according to the third embodiment differs from the receiving apparatus of the first embodiment in including, besides the variable gain amplifiers for AGC, another type of variable gain amplifiers which are used for standardizing the gains of the respective signal processing units. The variable gain amplifier is inserted in series in each signal processing unit.

FIG. 4 is a functional block diagram showing an overall structure of the receiving apparatus 2 according to the third embodiment. The same reference numerals are given to the same component parts as in the receiving apparatus 1 of the first embodiment, and their descriptions are omitted here.

Figure 5:
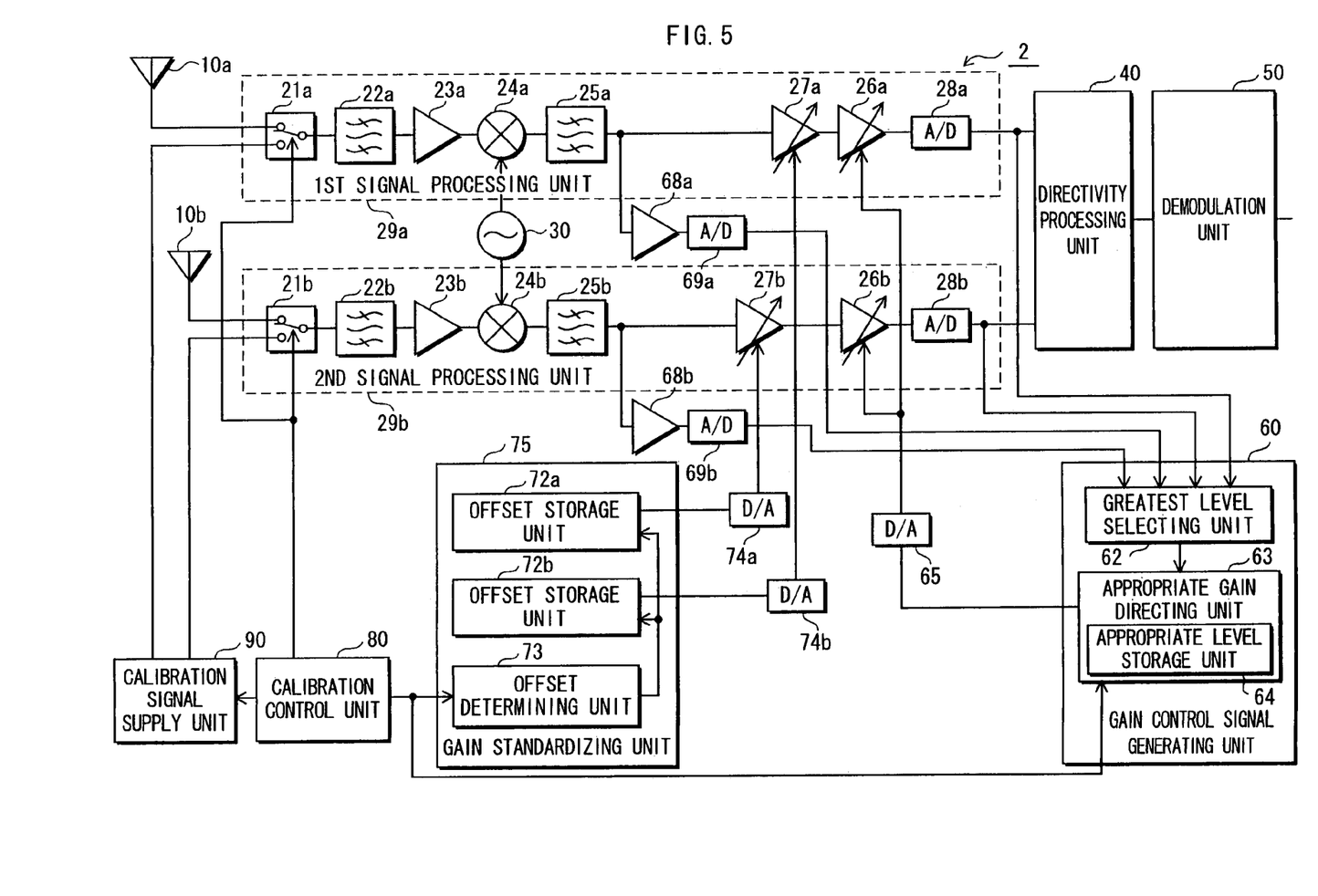
FIG. 5 is a functional block diagram showing an overall structure of a receiving apparatus 2.

In the receiving apparatus 2, the gain control signal generated by the gain control signal generating unit 60 is converted into an analog voltage signal by the D/A converter 65 without an offset for the gain standardization being added. The analog voltage signal is used to uniformly control the AGC variable gain amplifiers 26*a* and 26*b*.

The gain standardization for the respective signal processing units is performed by variable gain amplifiers 27*a* and 27*b* inserted in series in the 1st and 2nd signal processing units, respectively.

A gain standardizing unit 75 does not include the offset adding units. Each of the offset storage units 72*a* and 72*b* stores in advance an offset to counterbalance a gain deviation of the corresponding signal processing unit, and the gains of the variable gain amplifiers 27*a* and 27*b* are respectively controlled according to the stored offsets.

As in the first embodiment, for example, the following technique can be used to obtain such offsets. In the manufacturing process of the receiving apparatus, the offset values are changed within predetermined ranges while adjustment signals of the same level are being input to the antennas 10*a* and 10*b*, respectively. Then, the offset values of when the 1st and 2nd signal processing units 20*a* and 20*b* yield signals of the same level are stored in the offset storage units 72*a* and 72*b*. Or alternatively, the offset values can be calibrated in an operation phase of the receiving apparatus by using a calibration signal and a gain control signal for calibration.

In addition, in the case when calibration is not carried out in the operation phase, the structure for the calibration can be omitted, and the variable gain amplifiers 27*a* and 27*b* may be replaced by trimmer potentiometers. In such a case, in the manufacturing process of the receiving apparatus, for example, adjustment signals of the same level are input to the antennas 10*a* and 10*b*, respectively, and the respective trimmer potentiometers are then fixed to points of when the 1st and 2nd signal processing units 20*a* and 20*b* yield signals of the same level.

4. Modifications

Although the present invention has been described based on the above embodiments, it is a matter of course that the present invention is not confined to these embodiments. The following cases are also within the scope of the present invention.

[1] The present invention shall comprise a plurality of antennas and a plurality of signal processing units; however, the number of the antennas and that of the signal processing units are not limited. A receiving apparatus comprising four antennas and four signal processing unit, for example, is also within the scope of the present invention.

[2] The above embodiments are illustrated by examples in which each of the signal processing units includes a mixer to perform a single-stage frequency conversion on a signal in the radio frequency range; however, the number of stages of the frequency conversion is not related to the subject matter of the present invention, and a structure in which each signal processing unit includes a two- or multi-stage frequency conversion mixer is within the scope of the present invention.

[3] When applied to a plurality of transmitting signal processing units, the gain standardization technique of the present invention exerts an effect of standardizing the gains of the respective signal processing units by the same process. That is, the present invention also includes: a transmitting apparatus having a structure in which offsets are respectively added to a gain control signal used for uniformly performing AGC on the plurality of transmitting signal processing units, in order to counterbalance gain deviations of the respective transmitting signal processing units; and a transmitting apparatus into which gain regulators are inserted that have gains to counterbalance gain deviations of the respective transmitting signal processing units.

INDUSTRIAL APPLICABILITY

The receiving apparatus according to the present invention is applicable, for example, to radio communication devices selectively communicating with a target device in a desired direction by using an adaptive array system.

The invention claimed is:

1. A receiving apparatus including a plurality of antennas and a plurality of signal processing units, each of which processes a received signal of one of the plurality of antennas, comprising:
   a gain control signal generating unit operable to generate a gain control signal based on a signal obtained from one of the plurality of signal processing units;
   a plurality of variable gain units, (i) each of which is included in one of the plurality of signal processing units, and (ii) whose gains are controlled based on the gain control signal; and
   a gain standardizing unit operable to, when the gains are uniformly controlled based on the gain control signal, assign a gain to each of the plurality of signal processing units to offset a gain deviation occurring therein.

2. The receiving apparatus of claim 1, wherein
   the gain standardizing unit comprises a plurality of gain regulators, each of which is included in one of the plurality of signal processing units and assigns the gain to the one of the plurality of signal processing units to offset the gain deviation occurring therein.

3. The receiving apparatus of claim 1, wherein
the gain standardizing unit prestores, for each of the plurality of signal processing units, an offset corresponding to the gain deviation,
the gain control signal is corrected, for each of the plurality of signal processing units, by adding the prestored offset thereto, and
the gains of the plurality of variable gain units are controlled, for each of the plurality of signal processing units, based on the corrected gain control signal.

4. The receiving apparatus of claim 3, wherein
the gain standardizing unit prestores, for each of the plurality of signal processing units, a plurality of offsets corresponding to the gain deviation, in association with a plurality of different received signal frequencies and a plurality of different gain control signal levels, and
the gain control signal is corrected, for each of the plurality of signal processing units, by adding thereto one of the prestored plurality of offsets that is in association with a frequency of the received signal being actually processed and a level of the gain control signal.

5. The receiving apparatus of claim 3, further comprising:
a calibration signal supply unit operable to supply a calibration signal of a same level to the respective plurality of signal processing units; and
an offset determining unit operable to determine an offset for each of the plurality of signal processing units according to the calibration signal so as to standardize levels of signals obtained from the respective plurality of signal processing units, and
the gain standardizing unit updates, for each of the plurality of signal processing units, the prestored offset to the determined offset.

6. The receiving apparatus of any one of claims 1, 2, 3, 4, and 5, further comprising:
a directivity processing unit operable to obtain a desired directivity by processing signals obtained from the respective plurality of signal processing units, using adaptive array technique.

* * * * *